United States Patent [19]

Kawakami et al.

[11] Patent Number: 5,100,695
[45] Date of Patent: Mar. 31, 1992

[54] METHOD OF MANUFACTURING A PRINTED CIRCUIT BOARD

[75] Inventors: Shin Kawakami; Satoshi Haruyama; Hirotaka Okonogi, all of Iruma, Japan

[73] Assignee: Nippon CMK Corp., Japan

[21] Appl. No.: 445,744

[22] Filed: Nov. 29, 1989

[30] Foreign Application Priority Data

Nov. 30, 1988 [JP] Japan .................... 63-303813

[51] Int. Cl.⁵ ............................. C23C 26/00
[52] U.S. Cl. ........................... 427/96; 427/126.3
[58] Field of Search ................. 427/96, 126.3

[56] References Cited

U.S. PATENT DOCUMENTS

| | | | |
|---|---|---|---|
| 4,486,466 | 12/1984 | Leech | 427/96 |
| 4,569,902 | 2/1986 | Saito | 427/126.3 |
| 4,678,529 | 7/1987 | Drake | 156/23 X |
| 4,808,434 | 2/1989 | Bennett | 427/96 |
| 4,814,040 | 3/1989 | Ozawa | 427/96 |

FOREIGN PATENT DOCUMENTS 143475  9/1982  Japan .................... 427/96

Primary Examiner—Shrive Beck
Assistant Examiner—Vi Duong Dang
Attorney, Agent, or Firm—Bruce L. Adams; Van C. Wilks

[57] ABSTRACT

A method of manufacturing a printed circuit board for use in an electronic circuit is disclosed. The method comprises steps of forming a printed circuit on an insulating base board, of forming a circuit portion to be connected to the printed circuit by adhering a conductive ink on the base board, and of adhering the conductive ink through an uneven surface formed on a terminal portion to be connected to the printed circuit.

11 Claims, 2 Drawing Sheets

METHOD OF MANUFACTURING A PRINTED CIRCUIT BOARD

BACKGROUND OF THE INVENTION

The present invention relates to a method of manufacturing a printed circuit board, particularly, to a method of manufacturing a printed circuit board comprising a step of forming a printed circuit on an insulating base board and a step of forming a circuit portion to be connected to the printed circuit by adhering a conductive ink on the printed circuit.

In the conventional printed circuit board, in order to form a necessary circuit, such as a jumper circuit or the like while connecting a portion of another circuit to a terminal portion of the printed circuit, a conductive ink such as a copper paste or a silver paste or the like, is printed or provided on an insulating base board and hardened, thereby forming the circuit portion.

In such a conventional printed circuit board, when the circuit portion, such as the jumper circuit or the like, is formed by applicating the conductive paste such as copper paste on the insulating base board or by a silk screen printing, a problem arises in adhesion properties between the conductive paste or ink and the circuit terminal portion of copper foil provided on the printed circuit board. That is, the resin ink of the conductive paste has a small adhesive force to the metal surface compared with the common resin ink, since a great amount of conductive materials, such as carbon particles, silver particles or copper particles are mixed in the resin ink in order to increase conductivity, so that the resin amount effect on the adhesive force to the terminal portion becomes small. This causes a pealing-off of conductive paste from the terminal portion by a thermal shock in case of soldering electrical components to the terminal portion.

SUMMARY OF THE INVENTION

It is an object of the present invention to reject the above disadvantages of the conventional printed circuit board manufacturing method.

It is another object of the present invention to provide a method of manufacturing a printed circuit board capable of preventing a pealing-off of the conductive paste from the terminal portion, thereby forming a circuit having hard adhesion to the terminal portion of the printed circuit board.

According to the present invention, there is provided a method of manufacturing a printed circuit board comprising the steps of forming a printed circuit on an insulating base board, of forming a circuit portion to be connected to the printed circuit by adhering a conductive ink on the base board, and of adhering the conductive ink through an uneven surface formed on a terminal portion to be connected to the printed circuit.

The uneven surface of the terminal portion comprises a plurality of concave portion formed on the terminal portions. The uneven surface of the terminal portion comprises a plurality of column shaped projections formed on the terminal surface. The uneven surface of the terminal portion comprises a plurality of projecting strips placed on the terminal surface. The conductive ink is a copper or a silver paste.

According to the method of manufacturing a printed circuit board of the present invention, the conductive paste is applied to the terminal portion of the printed circuit board through the uneven surface thereof, so that a contacting area between the conductive ink and the terminal portion becomes increased, thereby obtaining a large engaging force therebetween, and thus obtaining a stable adhesion to thermal effect and vibration, resulting in a high quality and stability for a printed circuit board.

BRIEF DESCRIPTION OF THE DRAWINGS

FIG. 2b is a cross section taken on line A—A in FIG. 2a.

DETAILED EXPLANATION OF THE PREFERRED EMBODIMENTS

Now to the drawings, there is shown one embodiment of a printed circuit board manufactured by a method of manufacturing a printed circuit board according to the present invention.

Figure 1:
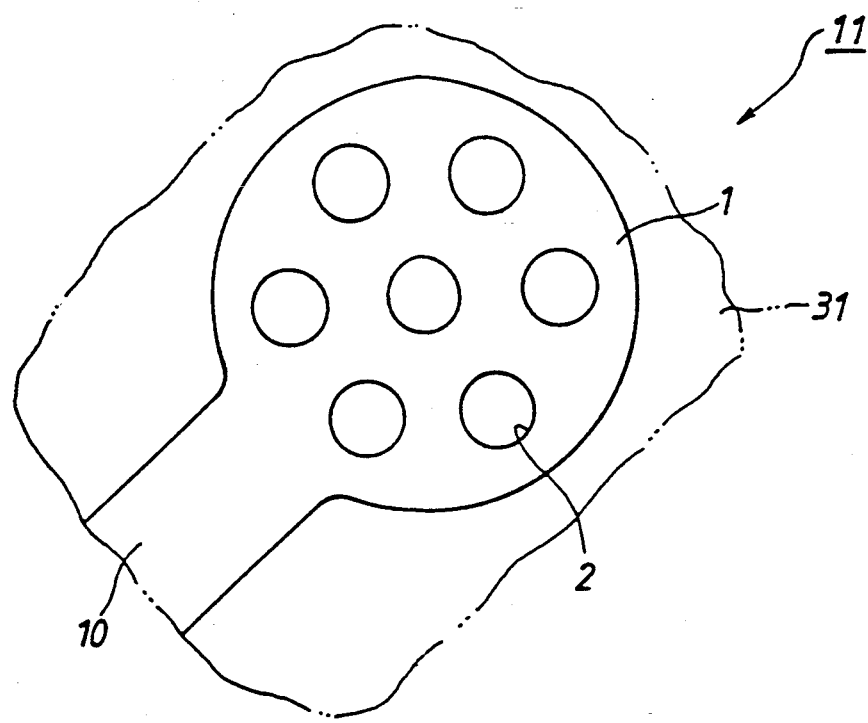
FIG. 1 is a partially enlarged plan view showing the uneven surface of a terminal portion to be connected in a method of manufacturing a printed circuit board according to the present invention.

In FIGS. 1 and 2, corresponding components are given the same reference numerals.

As shown in FIGS. 1 and 2, reference numeral 10 is a printed circuit of a printed circuit board 11. A terminal portion 1 of the printed circuit 10 is provided with a number of concave portions 2. Such a terminal portion 1 is formed in connection with etching steps in manufacturing steps of the printed circuit 10 of the printed circuit board 11, that is, by subjecting to an etching step many of the concave portions 2 can be made at the same time as the etching of the terminal portion 1, without requiring any excessive manufacturing step to the manufacturing step of the printed circuit 10 of the printed circuit board 11.

When the printed circuit 10 is formed while connecting another circuit, for example, a circuit 30, such as, a jumper line or the like, to the terminal portion 1 of the printed circuit 10 of the printed circuit board 11, a conductive ink 3, such as copper paste or silver paste or the like, is applied to the terminal portion 1 by a silk screen printing and then hardened.

According to the present invention, the connecting portion of the thus formed circuit 30 to the terminal portion 1 of the printed circuit 10 causes an increases of contacting area therebetween and an engaging effect between the terminal portion 1 and a connecting portion 30a formed by the conductive ink 30, thereby compensating the decrease of adhesive properties of the conductive ink itself to a metal surface and thus a good adhesion having no pealing-off of the conductive paste from the terminal portion due to thermal and vibrating effects.

It is further understood by those skilled in the art that the foregoing is a preferred embodiment of the disclosed method and that various changes and modification may be made in the invention without departing from the spirit and scope thereof.

For example, the uneven surface of the terminal portion may also be formed by a method of integrally forming a number of column shaped projections or other projecting strips on the terminal portion, instead of forming a number of concave portions 2 by etching the terminal portion.

The connecting circuit 30 may be formed after providing an insulating layer (not shown) on the printed circuit 10, if necessary.

Figure 2A:
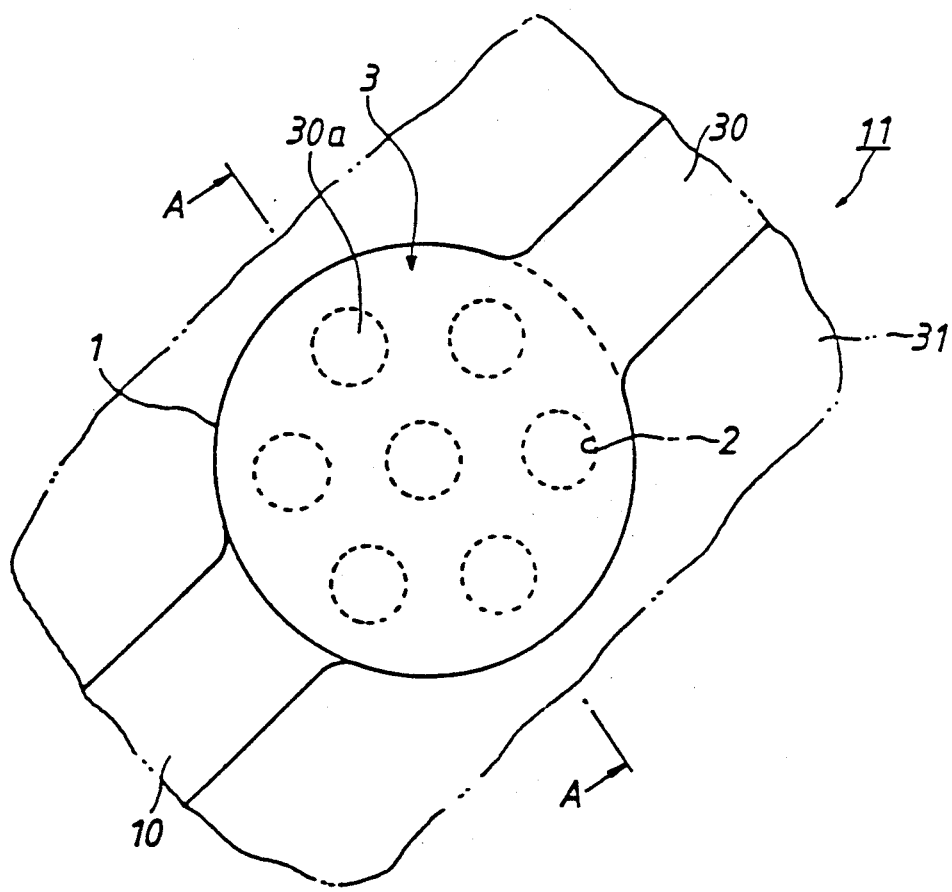
FIG. 2a is an enlarged plan view showing the portion of the terminal portion of FIG. 1 on which a connecting circuit is formed by applying conductive paste.
Figure 2B:
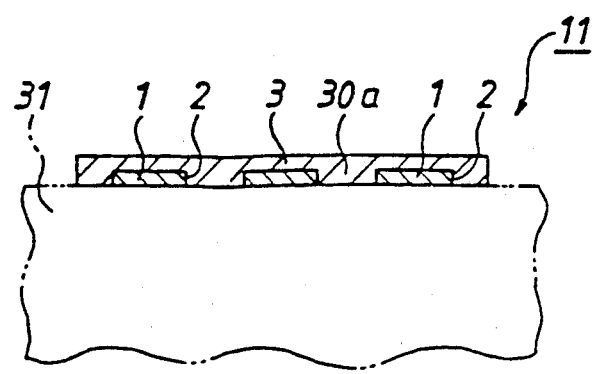

In FIGS. 2a and 2b, numeral 31 shows an insulating base board.

What is claimed is:

1. A method of manufacturing a printed circuit board, comprising the steps of: forming a printed circuit on an insulating base board having an even surface and having a terminal portion with an uneven surface, forming a circuit portion to be connected to the printed circuit by adhering a conductive ink on the base board, and adhering the conductive ink on the uneven surface of the terminal portion of the printed circuit, wherein the uneven surface of the terminal portion comprises a plurality of concave portions formed on the terminal portion.

2. A method of manufacturing a printed circuit board, comprising the steps of: forming a printed circuit on an insulating base board having an even surface and having a terminal portion with an uneven surface, forming a circuit portion to be connected to the printed circuit by adhering a conductive ink on the base board, and adhering the conductive ink on the uneven surface of the terminal portion of the printed circuit, wherein the uneven surface of the terminal portion comprises a plurality of column shaped projections formed on the terminal surface.

3. A method of manufacturing a printed circuit board, comprising the steps of: forming a printed circuit on an insulating base board having an even surface and having a terminal portion with an uneven surface, forming a circuit portion to be connected to the printed circuit by adhering a conductive ink on the base board, and adhering the conductive ink on the uneven surface of the terminal portion of the printed circuit, wherein the uneven surface of the terminal portion comprises a plurality of projecting strips placed on the terminal surface.

4. A method of manufacturing a printed circuit board, comprising the steps of:

forming on an insulating base a printed circuit having a main portion with an even surface and at least one terminal portion with an uneven surface for providing a connection to another printed circuit, wherein the step of forming the printed circuit includes forming a plurality of depressions in the surface of the at least one terminal portion; and connecting the at least one terminal portion of the printed circuit to another printed circuit by applying a conductive ink on the insulating base and on the uneven surface of the at least one terminal portion to increase the adhesion between the two printed circuits.

5. A method of manufacturing a printed circuit board, comprising the steps of:

forming on an insulating base a printed circuit having a main portion with an even surface and at least one terminal portion with an uneven surface for providing a connection to another printed circuit, wherein the step of forming the printed circuit includes forming a plurality of projections extending outwardly from the surface of the at least one terminal portion; and connecting the at least one terminal portion of the printed circuit to another printed circuit by applying a conductive ink on the insulating base and on the uneven surface of the at least one terminal portion to increase the adhesion between the two printed circuits.

6. A method of manufacturing a printed circuit board, comprising the steps of:

forming on an insulating base a printed circuit having a main portion with an even surface and at least one terminal portion with an uneven surface for providing a connection to another printed circuit, wherein the step of forming the printed circuit includes forming a plurality of strips on the surface of the at least one terminal portion and projecting upwardly therefrom; and connecting the at least one terminal portion of the printed circuit to another printed circuit by applying a conductive ink on the insulating base and on the uneven surface of the at least one terminal portion to increase the adhesion between the two printed circuits.

7. A method of manufacturing a printed circuit board, comprising the steps of: forming of an insulating base a printed circuit having a main portion with an even surface and at least one terminal portion with an uneven surface for providing a connection to another printed circuit, wherein the uneven surface of the at least one terminal portion is formed at the same time as the forming of the even surface of the main portion of the printed circuit; and connecting the at least one terminal portion of the printed circuit to another printed circuit by applying a conductive ink on the insulating base and on the uneven surface of the at least one terminal portion to increase the adhesion between the two printed circuits.

8. A method of manufacturing a printed circuit board as claimed in claim 2, wherein the conductive ink is a copper paste or a silver paste.

9. The method according to claim 7, wherein the step of applying a conductive ink comprises silk screening a conductive ink on the surface of the at least one terminal portion.

10. The method according to claim 7, wherein the conductive ink comprises copper paste.

11. The method according to claim 7, wherein the conductive ink comprises silver paste.

* * * * *